United States Patent
Matano

[19]
[11] Patent Number: 6,137,343
[45] Date of Patent: Oct. 24, 2000

[54] SEMICONDUCTOR MEMORY DEVICE EQUIPPED WITH VOLTAGE GENERATOR CIRCUIT

[75] Inventor: Tatsuya Matano, Tokyo, Japan

[73] Assignee: NEC Corporation, Tokyo, Japan

[21] Appl. No.: 08/758,088

[22] Filed: Nov. 27, 1996

[30] Foreign Application Priority Data

Nov. 29, 1995 [JP] Japan .................................. 7-311241

[51] Int. Cl.[7] ................................................... G05F 1/10
[52] U.S. Cl. ........................................ 327/535; 327/536
[58] Field of Search .................................. 327/534, 535, 327/536, 537; 307/110

[56] References Cited

U.S. PATENT DOCUMENTS

| | | | |
|---|---|---|---|
| 4,935,644 | 6/1990 | Tsujimoto | 327/536 |
| 5,029,063 | 7/1991 | Lingstaedt et al. | 327/534 |
| 5,140,182 | 8/1992 | Ichimura | 327/536 |
| 5,266,842 | 11/1993 | Park | 327/534 |
| 5,343,088 | 8/1994 | Jeon | 327/536 |
| 5,357,416 | 10/1994 | Kitano et al. | 323/313 |
| 5,367,489 | 11/1994 | Park et al. | 327/536 |
| 5,396,114 | 3/1995 | Lee et al. . | |
| 5,434,820 | 7/1995 | Kim | 327/535 |
| 5,444,362 | 8/1995 | Chung et al. | 323/313 |
| 5,701,096 | 12/1997 | Higashiho | 327/536 |

FOREIGN PATENT DOCUMENTS

| | | |
|---|---|---|
| 5-54649 | 3/1993 | Japan . |
| 5234373 | 9/1993 | Japan . |
| 6-60653 | 3/1994 | Japan . |
| 7-45074 | 2/1995 | Japan . |

*Primary Examiner*—Terry D. Cunningham
*Attorney, Agent, or Firm*—Sughrue, Mion, Zinn, Macpeak & Seas. PLLC

[57] ABSTRACT

A semiconductor circuit comprises an oscillator producing an oscillation signal, a voltage generation circuit generating, when activated, an output voltage in response to the oscillation signal, and a sensor circuit outputting a sensor signal when the output signal reached a predetermined voltage and supplying the sensor signal to the voltage generation circuit to deactivate the voltage generation circuit irrespective of the oscillation signal.

6 Claims, 15 Drawing Sheets

SEMICONDUCTOR MEMORY DEVICE EQUIPPED WITH VOLTAGE GENERATOR CIRCUIT

BACKGROUND OF THE INVENTION

1. Field of the Invention

The present invention relates to a semiconductor memory device, and more particularly to a voltage generator circuit for use in semiconductor memory devices having circuits which use higher DC voltages than the external power source.

2. Description of the Prior Art

Recently, there are significant trends toward higher-integration, larger-capacity semiconductor memory devices as the development of microprocessing techniques for semiconductors has surged forward. Particularly, in the field of dynamic memories (DRAMs) of semiconductor memory devices which allow random access, samples of 256-mbit DRAMs are being shipped, and gigabit-level DRAMs are being presented at academic meetings. Keeping pace with the progress of such semiconductor memory devices, the voltage supplied to memory devices from external power sources is becoming lower. For example, a source voltage of 5.0 V is used for 16-mbit DRAMs, and a source voltage of 3.3 V for 64 mbit DRAMs. Such reduction in source voltage must also be achieved to ensure the reliability of minute, larger-capacity semiconductor memory devices, by way of prevention of breakdown of gate oxide thin films, time-varying transistor characteristics, etc.

In particular, the technique for lowering external power sources (external line voltages) in the chips to produce the inner source voltages may be applied to DRAMs. The use of lower and more stable inner line voltages than the external source voltages ensures adequate reliability of the devices. In the case of DRAMs, however, in order to write high-level (hereunder abbreviated to "H-level") voltages (equal to the inner source voltages) to the capacitors of the memory cells, higher voltages than the H-level write voltages, that is, the total of the H-level write voltages and the threshold voltages of the transistors, must be applied to the word lines of the memory cells. Therefore, higher and more stable voltages than the external source voltages must be generated even with the ever-lowering level of the source voltages for memory devices. The circuits for generating voltages to be applied to the word lines, etc. by increasing the source voltages are called voltage generator circuits.

An example of prior art boosted-voltage generator circuits is the boosted-voltage generator circuit disclosed in Japanese Unexamined Patent Application Disclosure HEI 5-217372, which is shown in the block diagram of FIG. 1. Referring to FIG. 1, in the circuit shown in the drawing, a booster circuit section 302 performs a pumping operation in response to an oscillation output φOSC from an oscillator 200. The oscillator 200 is normally under control of a $V_{PP}$ sensor circuit 100 which senses that the output voltage $V_{OUT}$ is lower than a predetermined boosted-voltage $V_{PP}$. When the output voltage $V_{OUT}$ becomes lower than the predetermined $V_{PP}$, the $V_{PP}$ sensor signal $\phi_{PP}$ is activated to actuate the oscillator 200. When the output voltage $V_{OUT}$ has reached the predetermined $V_{PP}$, the signal $\phi_{PP}$ is deactivated through the $V_{PP}$ sensor circuit 100 to suspend the oscillator 200.

The operation of the boosted-voltage generator circuit shown in FIG. 1 will now be described in detail. FIG. 2 is a circuit diagram of the booster circuit section 302 in the block diagram of FIG. 1. FIG. 3 is a timing chart illustrative of the waveforms during a voltage-boosting operation. Referring to FIG. 1 through FIG. 3, when an H-level signal $\phi_{OSC}$ is input from the oscillator 200, an H-level signal is output from an inverter 124 via a NAND gate 114. Here, a voltage precharged to the vicinity of the source voltage $V_{CC}$ of a node $N_{12}$ is boosted to the vicinity of $2V_{CC}$ by a coupling capacitor $C_{13}$. Likewise, an H-level signal is output from an inverter 128, and a voltage precharged to the vicinity of the line voltage $V_{CC}$ of a node $N_{14}$ is boosted to the vicinity of $2V_{CC}$ by a coupling capacitor $C_{14}$. An output transistor $M_{12}$ is then brought into conduction with an output terminal 7 thereby to boost the output voltage $V_{OUT}$. Here, a transistor $M_{32}$, inputting the voltage across the node $N_{12}$ to the gate is brought into conduction with a power supply terminal 8 thereby to precharge the voltage across a node $N_{11}$ to the vicinity of the line voltage $V_{CC}$. In addition, a transistor $M_{36}$ inputting the voltage of the node $N_{14}$ to the gate is brought into conduction with the power supply terminal 8 thereby to precharge the voltage across a node $N_{13}$ to the vicinity of the line voltage $V_{CC}$.

Then, when a low-level (hereunder abbreviated to "L-level") signal $\phi_{OSC}$ is input from the oscillator 200, L-level signals are output from the inverters 124 and 128 via the NAND gate 114. Subsequently, the voltage across the node $N_{12}$ drops to lower than $V_{CC}$ by a coupling capacitor $C_{13}$ and the voltage across the node $N_{14}$ drops to $V_{CC}$ by a coupling capacitor $C_{14}$, thereby bringing the transistor $M_{12}$ out of conduction with the output terminal 7. An H-level signal is output from an inverter 122 via a NOR gate 113. Here, the voltage across the node $N_{11}$ which has been precharged to the source voltage $V_{CC}$, is boosted to the vicinity of $2V_{CC}$ by a coupling capacitor $C_{12}$. Likewise, an H-level signal is output from an inverter 126, and the voltage across a node $N_{13}$ which has been precharged to the vicinity of the source voltage $V_{CC}$ has a voltage boosted to the vicinity of $2V_{CC}$ by a coupling capacitor $C_{14}$. An output transistor $M_{11}$ is then brought into conduction with the output terminal 7 thereby to boost the output voltage $V_{OUT}$. Here, a transistor $M_{33}$ inputting the voltage across the node $N_{11}$ to the gate is brought into conduction with the power supply terminal 8 thereby to precharge the node $N_{12}$ to the vicinity of the source voltage $V_{CC}$. In addition, a transistor $M_{37}$ inputting the voltage across the node $N_{13}$ to the gate is brought into conduction with the power supply terminal 8 to precharge the node $N_{14}$ to the vicinity of $V_{CC}$.

In this way, the two output transistors $M_{11}$ and $M_{12}$ are alternately brought into conduction with the output terminal 7 in response to complementary signals depending on the oscillation outputs from the oscillator 200, to successively perform the voltage-boosting operation.

The prior art boosted-voltage generator circuit illustrated in FIG. 1 and FIG. 2 has the problems of big fluctuations of the output voltage, and much time spent to recover a predetermined value. The problems will now be explained.

First, when an boosting operation is initiated in the prior art circuit, a drop in the output voltage $V_{OUT}$ is sensed by the sensor circuit 100 which activates a sensor signal $\phi_{PP}$ and the oscillator 200 is actuate by the sensor signal $\phi_{PP}$. An oscillation output $\phi_{OSC}$ is then input from the oscillator 200 to a booster circuit section 302 to boost the output voltage $V_{OUT}$ to the predetermined value $V_{PP}$. Therefore, there is a time lag due to the time lapsed until the oscillator 200 starts to oscillate, between the time at which a drop in level of the output voltage $V_{OUT}$ is sensed and the time at which the booster circuit section 302 is actuated to initiate a voltage-boosting operation. As a result, the output voltage $V_{OUT}$ greatly drops depending on the time lag, and thus much time is required to restore the voltage to the predetermined $V_{PP}$. On the other hand, when the voltage-boosting operation is suspended, after the output voltage $V_{OUT}$ has reached the predetermined value $V_{PP}$ as a result of the voltage-boosting operation mentioned above, the sensor signal $\phi_{PP}$ is deactivated through the sensor circuit 100 to suspend the oscillator 200. Therefore, oscillation outputs, which have been output until the oscillator 200 is suspended after the sensor signal $\phi_{PP}$ has been deactivated, are input to the booster circuit section 302, thereby excessively boosting the voltage. As described above, the delay in response of the operation of the booster circuit section 302 to the fluctuations of the output voltage $V_{OUT}$ causes the process of return to the predetermined value $V_{PP}$ to be delayed and the voltage to be excessively boosted, and this results in great fluctuations of the output voltage $V_{OUT}$.

In addition, although the booster circuit section 302 illustrated in FIG. 2 has the advantage of being capable of using the voltage across a node which has been boosted by the capacitor on any one side to precharge the respective nodes on the other side, the precharging power is not sufficient. Accordingly, the voltage-boosting power is insufficient, and thus much time is spent to recover the predetermined value. Let us consider the operation of the transistor $M_{12}$, for example. The voltage across the node $N_{12}$ is boosted to the vicinity of $2V_{CC}$. The voltage across the node $N_{12}$ is applied to the gate electrode of the transistor $M_{32}$ for precharging the node $N_{11}$, to bring the transistor $M_{32}$ into conduction. However, when continuity is established between the drain electrode (node $N_{12}$) of the transistor $M_{12}$ and the output terminal 7 as a result of boosting the node $N_{14}$ to $2V_{CC}$, the voltage across the node $N_{12}$ which has been boosted to $2V_{CC}$ plunges to $V_{PP}$. As a result, the capability of the transistor $M_{32}$ is degraded, and this causes the voltage across the precharged node $N_{11}$ to fall to lower than the line voltage $V_{CC}$. The result is lower drain voltage of the output transistor $M_{11}$ while a boosting operation is being performed, and the boosting capability of the booster circuit section 302 is insufficient during pumping. The above-described applies to the other output transistor $M_{12}$ as well.

SUMMARY OF THE INVENTION

Accordingly, it is an object of the present invention, to provide a semiconductor memory device equipped with a boosted-voltage generator circuit, which is designed to minimize the delay in response to fluctuations of the output boosted voltage.

It is other object of the present invention to prevent the variations in the output voltage due to the excessively boosted voltage.

It is other object of the present invention to speed up the process of return to a predetermined voltage.

It is another object of the present invention to enhance the precharging capability during a pumping operation and eventually the voltage-boosting capability, thereby speeding up the process of return to a predetermined voltage.

A semiconductor circuit comprises an oscillator producing an oscillation signal, a voltage generation circuit generating, when activated, an output voltage in response to the oscillation signal; and a sensor circuit outputting a sensor signal when the output signal reached a predetermined voltage and supplying the sensor signal to the voltage generation circuit to deactivate the voltage generation circuit irrespective of the oscillation signal.

BRIEF DESCRIPTION OF THE DRAWING

The above and other objects, advantages and features of the present invention will be more apparent from the following description taken in conjunction with the accompanying drawings, in which.

DETAILED DESCRIPTION OF THE PREFERRED EMBODIMENTS

Figure 1:
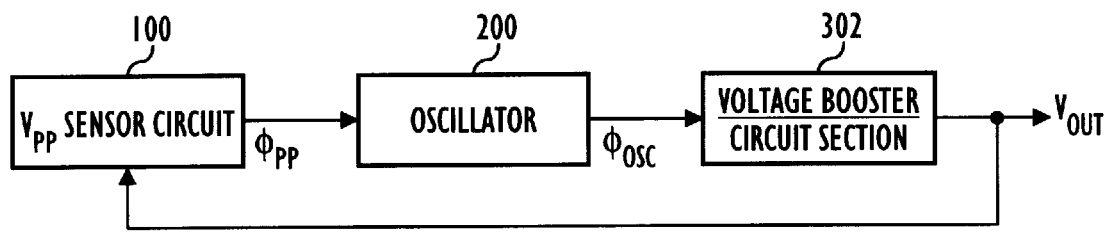
FIG. 1 is a block diagram of a boosted-voltage generator circuit according to the prior art.
Figure 2:
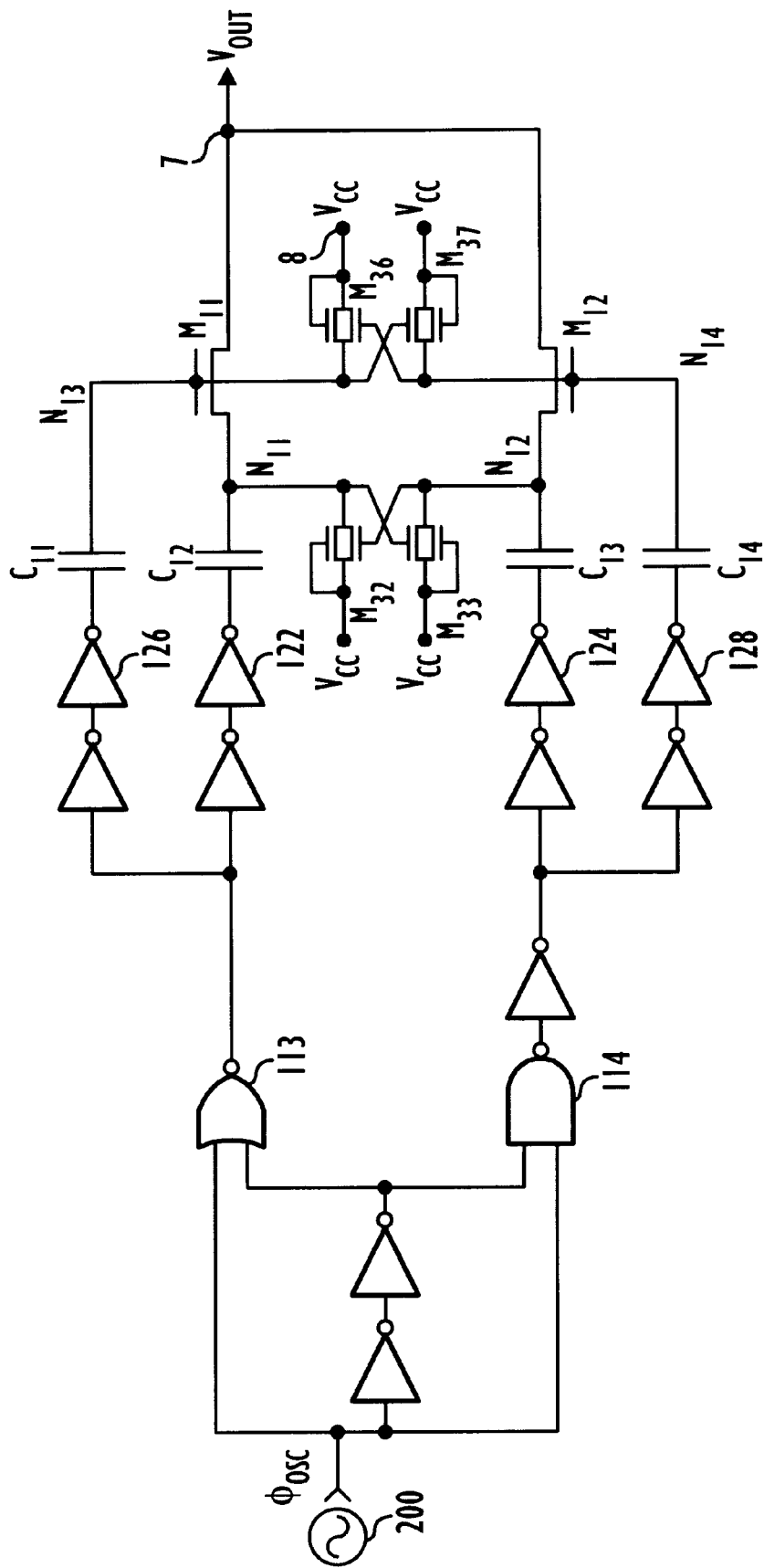
FIG. 2 is a circuit diagram of a booster circuit section available for use in the boosted-voltage generator circuit illustrated in FIG. 1.
Figure 3:
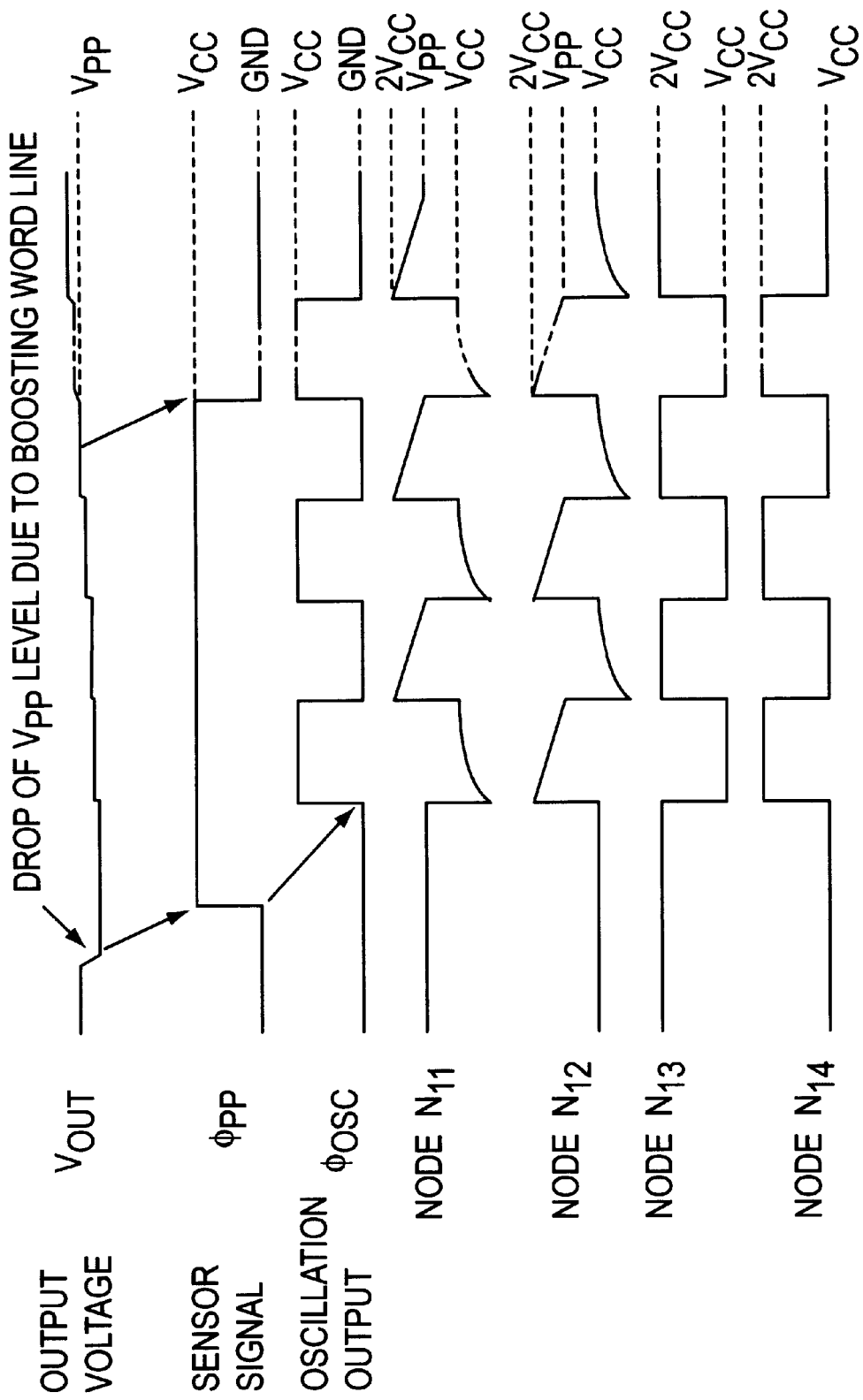
FIG. 3 is a timing chart illustrative of the operation waveforms observed in the boosted-voltage generator circuit illustrated in FIG. 1.
Figure 4:
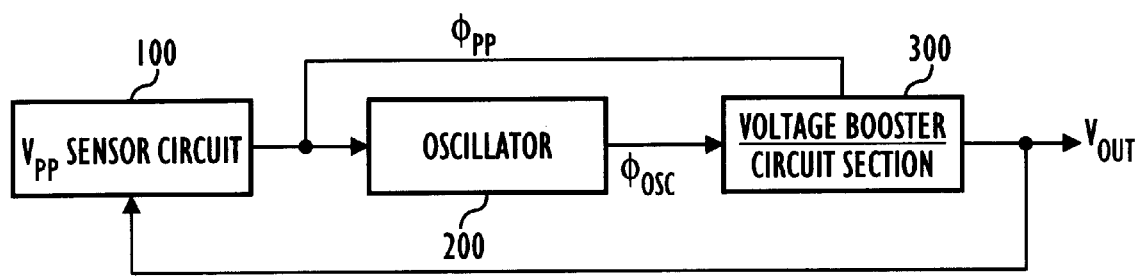
FIG. 4 is a block diagram of a boosted-voltage generator circuit according to a first embodiment of the present invention.

Referring to FIG. 4, with a boosted-voltage generator circuit according to the present embodiment, when the $V_{PP}$ sensor signal $\phi_{PP}$ from a $V_{PP}$ sensor circuit 100 is activated, a voltage booster circuit section 300 directly initiates a pumping operation in response to the sensor signal $\phi_{PP}$. The voltage booster circuit section 300 continues the pumping operation in response to an oscillation output $\phi_{OSC}$ from an oscillator 200 which is subsequently input thereto. The oscillator 200 is controlled by the sensor circuit 100, and oscillates when the sensor signal $\phi_{PP}$ is activated. On the other hand, when the output boosted voltage $V_{OUT}$ reaches a predetermined voltage $V_{PP}$, the sensor signal $\phi_{PP}$ is deactivated through the sensor circuit 100, and the sensor signal $\phi_{PP}$ directly suspends the pumping operation of the voltage booster circuit section 300.

Figure 5:
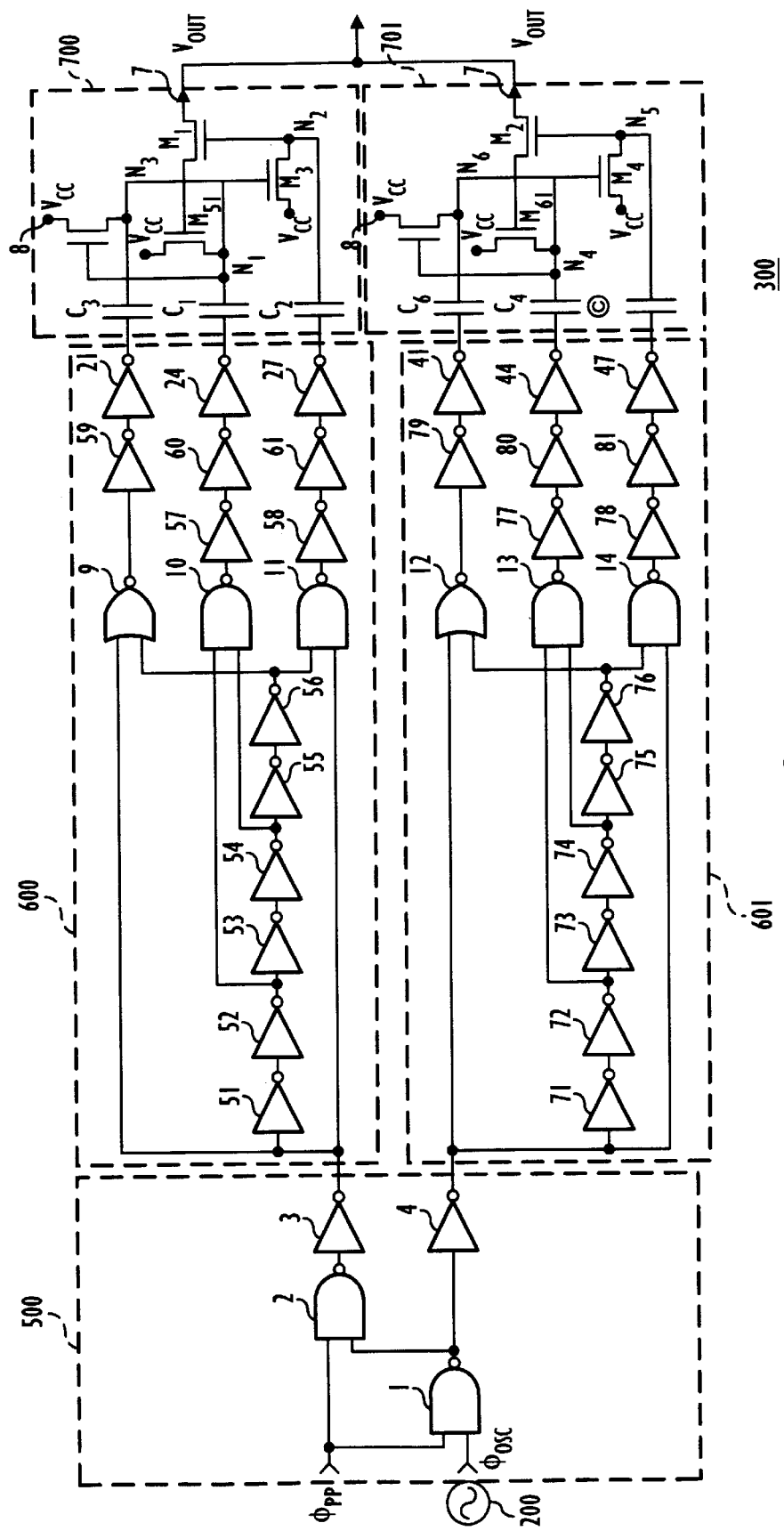
FIG. 5 is a circuit diagram of a booster circuit 300 available for use according to the first embodiment of the present invention.
Figure 6:
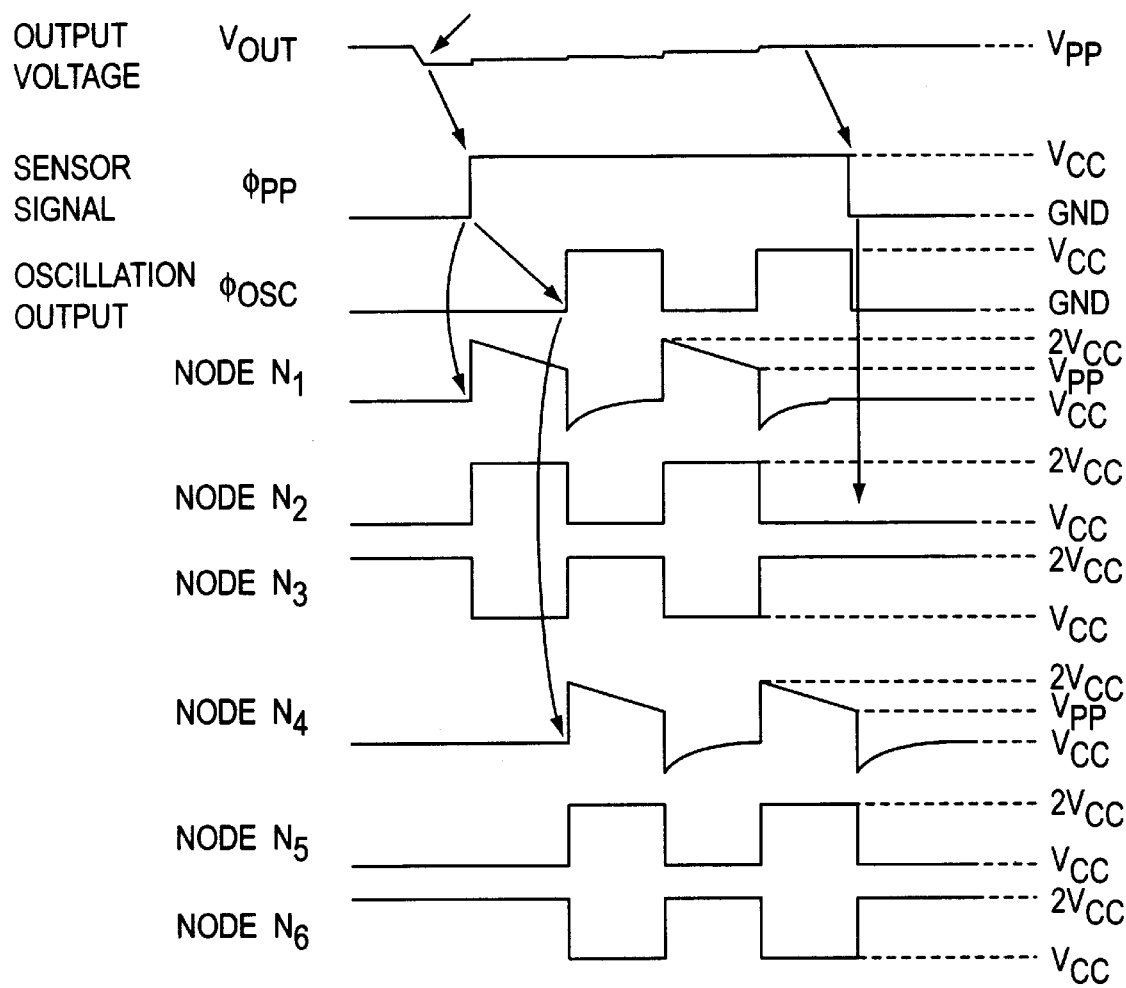
FIG. 6 is a timing chart illustrative of the operating waveforms observed according to the first embodiment of the present invention.

Referring to FIG. 4 through FIG. 6, the voltage booster circuit section 300 is constructed of an inlet section 500, two pulse converter sections 600 and 601, and two output sections 700 and 701. The six capacitors $C_1$–$C_6$ in the output sections 700 and 701 are formed of p-channel MOS transistors, etc. The transistors $M_1$–$M_4$, $M_{51}$, $M_{61}$ is a n-channel MOS transistors. The source voltage $V_{CC}$, which is usually an external source voltage supplied from outside the semiconductor memory device, may be an internal source voltage in cases where the predetermined boosted voltage $V_{PP}$ is not very high as compared with the internal source voltage which is generated inside the memory device.

The operation according to the present embodiment will now be described in detail. Assuming that the output voltage $V_{OUT}$ is lower than the predetermined value $V_{PP}$, the $V_{PP}$ sensor signal $\phi_{PP}$ is activated through the $V_{PP}$ sensor circuit 100, and an H-level sensor signal $\phi_{PP}$ is input to the oscillator 200. For example, the voltage $V_{PP}$ is 3.8 V, the external voltage is 3.3 V. The sensor signal $\phi_{PP}$ is concurrently input to the voltage booster circuit section 300 as well.

When the H-level sensor signal $\phi_{PP}$ is input to the voltage booster circuit section 300 (here, the oscillation output $\phi_{OSC}$ from the oscillator 200 is at the L-level), an H-level signal is output from an inverter 3 via a NAND gate 2, and a voltage-goosting operation is initiated at the output section 700 side. Here, since the output signal from an inverter 24 switches to the H-level, a voltage precharged to the vicinity of the source voltage $V_{CC}$ of a node $N_1$ is boosted to the vicinity of $2V_{CC}$ by a coupling capacitor $C_1$. In addition, since an L-level signal is output from an inverter 21, a voltage precharged to the vicinity of $2V_{CC}$ of a node $N_3$ is dropped to the vicinity of the source voltage $V_{CC}$ by a coupling capacitor $C_3$. Further, an H-level signal is output from an inverter 27, a voltage precharged to the vicinity of the source voltage $V_{CC}$ of a node $N_2$ is boosted to the vicinity of $2V_{CC}$ by a coupling capacitor $C_2$. An output transistor $M_1$ is then brought into conduction with an output terminal 7 thereby to boost the output voltage $V_{OUT}$.

Then, when an H-level oscillation signal $\phi_{OSC}$ is input from the oscillator 200 to the voltage booster circuit section 300 (here, the sensor signal $\phi_{PP}$ is at the H-level), an H-level signal is output from an inverter 4 via a NAND gate 1 to initiate a voltage-voosting operation at the output section 701 side. On the other hand, a precharging operation is initiated at the output section 700 side. Here, at the output section 701 side, the output signal from an inverter 44 switches to the H-level, and the voltage across a node $N_4$ which has been precharged to the vicinity of the source voltage $V_{CC}$, is boosted to the vicinity of $2V_{CC}$ by a coupling capacitor $C_4$. Further, since an L-level signal is output from an inverter 41, the voltage across a node $N_6$ which has been precharged to the vicinity of $2V_{CC}$, is dropped to the vicinity of the source voltage $V_{CC}$ by a capacitor $C_6$. In addition, an H-level signal is output from an inverter 47, and the voltage across a node $N_5$ which has been precharged to the vicinity of the source voltage $V_{CC}$, is boosted to the vicinity of $2V_{CC}$ by a coupling capacitor $C_5$. An output transistor $M_2$ is then brought into conduction with the output terminal 7 thereby to boost the output voltage $V_{OUT}$.

On the other hand, at the output section 700 side, the output signal from the inverter 27 switches to the L-level, and the voltage precharged to the vicinity of $2V_{CC}$ of the node N2 is dropped to the vicinity of the source voltage $V_{CC}$ by the coupling capacitor $C_2$. In addition, an H-level signal is output from the inverter 21, and the voltage precharged to the vicinity of the source voltage $V_{CC}$ of the node N3 is boosted to the vicinity of $2V_{CC}$. As a result, a transistor $M_{51}$ is brought into conduction with a power supply terminal 8 thereby to precharge the node N1 to the vicinity of the source voltage $V_{CC}$.

Then, when an L-level oscillation signal $\phi_{OSC}$ is input from the oscillator 200 to the voltage booster circuit section 300 (here, the sensor signal $\phi_{PP}$ is at the H-level), a voltage-boosting operation is initiated at the output section 700 side, while a precharging operation is initiated at the output section 701 side. Since the output signal from the inverter 47 switches to the L-level at the output section 701 side, the voltage across the node $N_5$ which has been precharged to $2V_{CC}$, drops to the vicinity of the source voltage $V_{CC}$ by the coupling capacitor $C_5$. In addition, since the output signal from the inverter 44 switches to the L-level, the voltage across the node N4 which has dropped to the vicinity of the predetermined $V_{PP}$, further drops to the source voltage $V_{CC}$ or less. In addition, an H-level signal is output from an inverter 41, and a voltage precharged to the vicinity of the source voltage $V_{CC}$ of a node N6 is boosted to the vicinity of $2V_{CC}$ by a coupling capacitor $C_6$. A transistor $M_{61}$ is brought into conduction with the power supply terminal 8 thereby to precharge the node N4 to the vicinity of the source voltage $V_{CC}$. Here, the voltage-boosting operation described above is performed at the output section 700 side.

After this, the output sections 700 and 701 alternately repeat the voltage-boosting operation and the precharging operation in response to the signals output from the oscillator 200.

When the output voltage $V_{OUT}$ has reached the predetermined $V_{PP}$, a deactivated L-level sensor signal $\phi_{PP}$ is input from the sensor circuit 100 to the voltage booster circuit section 300. This results in L-level signals being output from the inverter 3 via the NAND gate 2, and from the inverter 4 via the NAND gate 1 to initiate precharging the output transistors. The voltages across the nodes N2 and N5 shift to the source voltage $V_{CC}$, and the output transistors $M_1$ and $M_2$ are brought out of conduction with the output terminal 7. On the other hand, the voltages across the nodes N3 and N6 are boosted to the vicinity of $2V_{CC}$ and input to the gate electrodes of transistors $M_{51}$ and $M_{61}$ to bring the nodes N1 and N4 into conduction with the power supply terminal 8, thereby precharging the nodes N1 and N4 to the source voltage $V_{CC}$.

As described above, according to the present embodiment, the voltage booster circuit section 300 is directly boosted in response to an activated sensor signal $\phi_{PP}$, and continues the voltage-boosting operation in response to an oscillation output subsequently input from the oscillator, and after the output voltage $V_{OUT}$ has reached the predetermined $V_{PP}$, the operation of the voltage booster circuit section 300 is directly suspended upon receipt of an inactive sensor signal $\phi_{PP}$.

Figure 7:
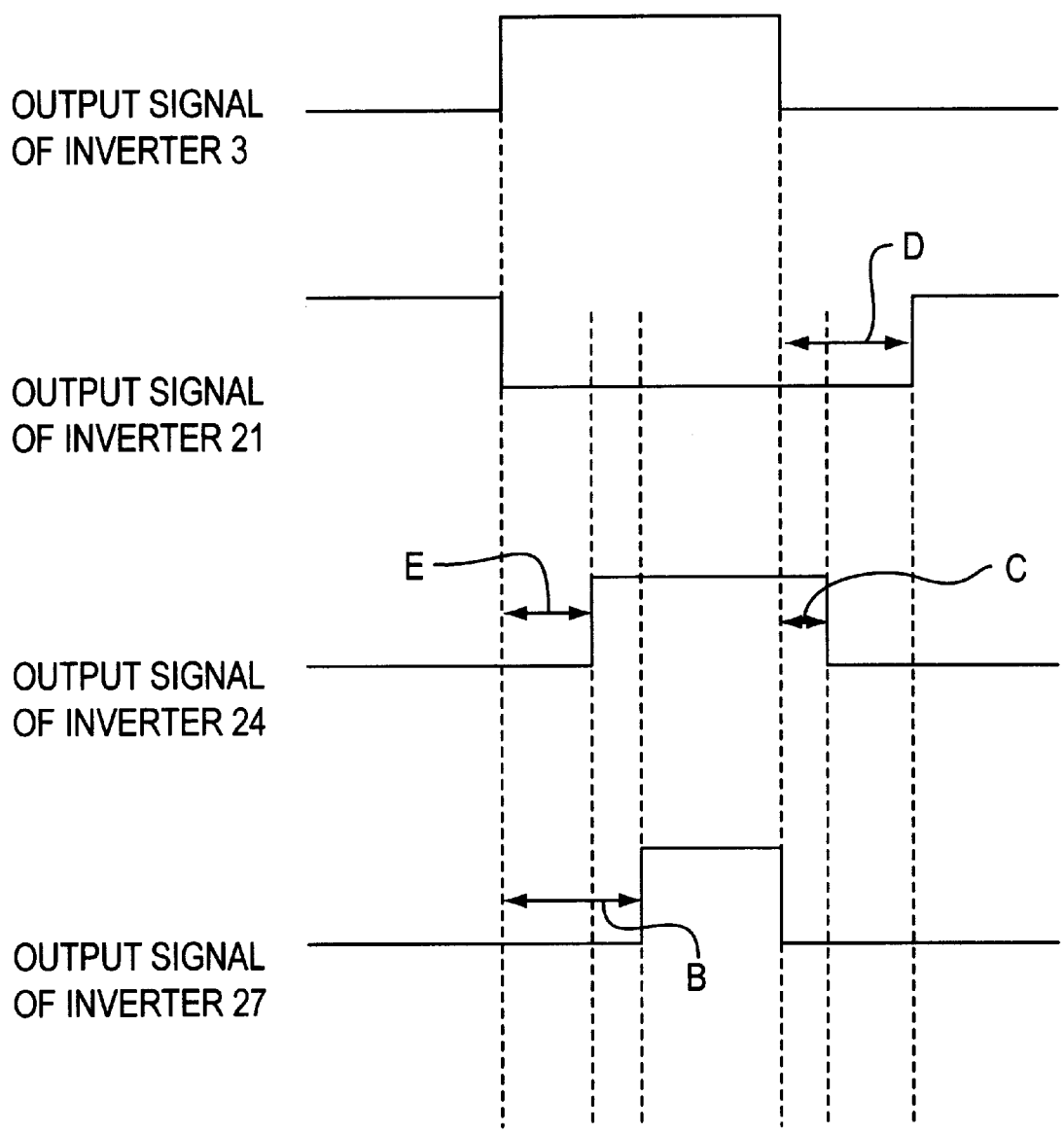
FIG. 7 is a timing chart illustrative of the operating waveforms of the voltage booster circuit section indicated in FIG. 5 of the present invention.

The inverters 51–56 is used to control timings of pulses input the capacitors C1, C2, and C3 respectively. For example, if the capacitor C2 receives a rising edge of the pulse output from the inverter 27 before the capacitor C1 receives a rising edge of the pulse output from the inverter 24, a reverse current from $V_{OUT}$ to the capacitor $C_1$ occurs, and if the capacitor $C_2$ receives a falling edge of the pulse output from the inverter 27 after the capacitor $C_1$ receives a falling edge of the pulse output from the inverter 24, the reverse current from $V_{OUT}$ to the capacitor $C_1$ also occurs. Therefore, respective timing of the pulses that the capacitors C1, C2, and C3 receive is controlled by inverters 51–56. Referring to FIG. 7, the operation of the pulse converter section 600 shown in FIG. 5 will now be described in detail. For example, a delay time DL1 is a total delay time occurred from the inverters 51, 52 and delay times DL2, DL3 are total delay times from the inverters 53, 54 and 55, 56 respectively. When the pulse converter section 600 receives a rising edge of the pulse outputted from inverter 3, the output of the inverter 21 changes from H-level to L-level immediately, and the output of the inverter 24 changes from L-level to H-level with spending a delay time E longer than an addition time of the delay times DL1 and DL2 and the output of the inverter 27 changes from L-level to H-level with spending a delay time longer B than an addition time of the delay times DL1, DL2 and DL3. On the other hands, when the pulse converter section 600 receives a falling edge of the pulse outputted from inverter 3, the output of the inverter 27 changes from H-level to L-level immediately, and the output of the inverter 24 changes from H-level to L-level with spending a delay time C longer than the delay time DL1 and the output of the inverter 21 changes from L-level to H-level with spending a delay time D longer than an addition time of the delay times DL1, DL2 and DL3.

The inverters 59–61, 21, 24, and 27 is provided to control a fanout from the NOR circuit 9, NAND circuits 10, 11 to the respective capacitors C3, C1, and C2. Therefore, the inverters 59–61, 21, 24, and 27 may delete in case the capacities of the respective capacitor C1, C2, and C3 is small.

Figure 8A:
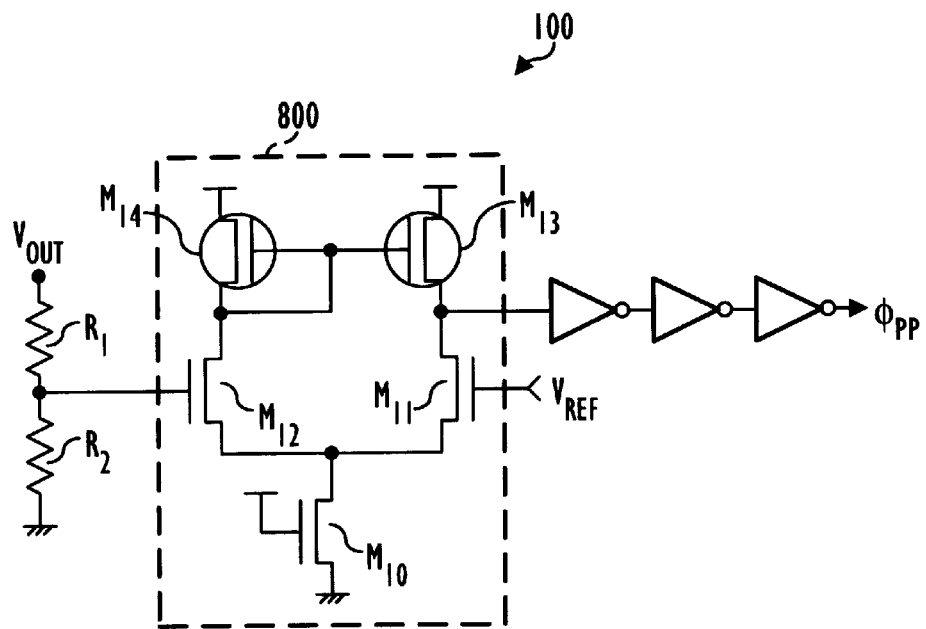
FIG. 8a and FIG. 8b are circuit diagrams of examples of the $V_{PP}$ sensor circuit 100 and the oscillator 200 available for use according to the first embodiment of the present invention, respectively.
Figure 8B:
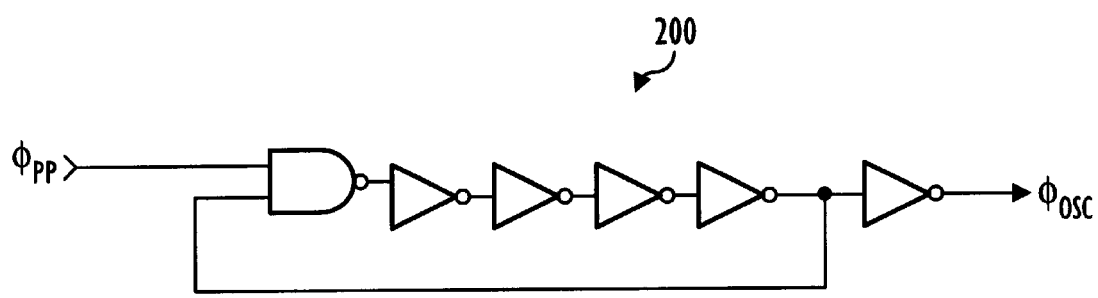

Here, the one configured as illustrated in the circuit diagram of FIG. 8a, for example, is used as the $V_{PP}$ sensor circuit 100 illustrated in the block diagram of FIG. 4. For example, a voltage $V_{REF}$ is 1.9 V and resistors $R_1$, $R_2$ are same resistance. The voltage $V_{REF}$ is produced by a voltage convert circuit converting the external voltage (3.3 V) to 1.9 V. The oscillator 200 may be used the one the circuit diagram thereof is illustrated in FIG. 8b. Referring to FIG. 8a, the sensor circuit 100 is designed so that a differential amplifier 800 compares the voltages across the nodes separated by resistors which are fractions of the output voltage $V_{OUT}$ with a reference voltage $V_{REF}$, and outputs the results of sensing. Transistors M10–M12 is n-channel type and transistors M13–M14 is p-channel type. Specifically, the $V_{PP}$ sensor signals $\phi_{PP}$ switches to the L-level (to the inactive state) in cases where the voltages across the nodes separated by resistors which are fractions of the output voltage $V_{OUT}$ are higher than the reference voltage $V_{REF}$, and to the H-level (to the active state) in the reverse case. On the other hand, referring to FIG. 8b, the oscillator 200 is designed so that the output signal $\phi_{OSC}$ is brought into the oscillated state when an activated H-level sensor signal $\phi_{PP}$ is input, whereas the output signal $\phi_{OSC}$ switches to the L-level when the sensor signal $\phi_{PP}$ is inactive and switches to the L level.

Although being described with reference to the case using only one each of the $V_{PP}$ sensor circuit 100 and oscillator circuit 200, the present invention may be applied to any other circuit configuration.

The configuration according to the present embodiment has the following characteristics. First, since the pumping operation of the voltage booster circuit section 300 is directly actuated in response to the sensor signal $\phi_{PP}$ activated by drop in the output voltage $V_{OUT}$, it is possible to shorten the time lag due to the time lapsed until the oscillator 200 starts to oscillate for initiating a voltage-boosting operation after the output voltage $V_{OUT}$ has dropped. This results in a small drop in the output voltage $V_{OUT}$ and a shorter time which is required to recover the predetermined $V_{PP}$. In addition, since after the output voltage $V_{OUT}$ has reached the predetermined $V_{PP}$, the output transistors $M_1$ and $M_2$ are isolated from the output terminal in response to a deactivated sensor signal $\phi_{PP}$ to directly suspend the boosting through the voltage booster circuit section 300, there is no risk of excessively boosting the output $V_{OUT}$ by the operation of the voltage booster circuit section 300 in response to the oscillation outputs during the time lag between the deactivation of the sensor signal $\phi_{PP}$ and the suspension of the oscillator 200. As a result, the process of restoring the output voltage $V_{OUT}$ to the predetermined value may be carried out at a higher speed, and the fluctuations thereof may be made smaller than according to the prior art.

Second, since a stable and high voltage may be applied to the gate electrodes of the precharging transistors $M_{51}$ and $M_{61}$ for establishing continuity between the drain nodes $N_1$, $N_4$ and the power supply terminal 8 in order to precharge the drain nodes $N_1$ and $N_4$ of the output transistors $M_1$ and $M_2$, the voltages across the drain nodes $N_1$ and $N_4$ may be precharged to the source voltage $V_{CC}$ with reliability. This results in increased voltage-boosting capacities of the output transistors $M_1$ and $M_2$, and in a higher speed for return to the predetermined value.

Figure 9:
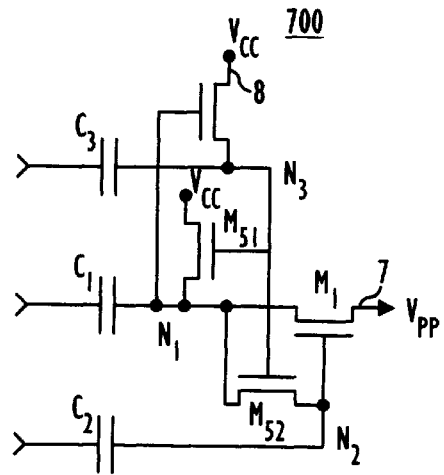
FIG. 9 is a circuit diagram illustrative of a modified version of the output section 700 available for use according to the first embodiment of the present invention.

The output sections 700 and 701 according to the present invention may be modified as illustrated in FIG. 9. Referring to FIG. 9, in the output section 700, as an example, a modification is made to the way of connecting the channel of a transistor $M_{52}$ which precharges the gate electrode (node $N_2$) of the output transistor $M_1$ when the voltage across the node $N_3$ is input to the gate electrode of the transistor $M_{52}$. More specifically, one end of the channel of the transistor $M_{52}$ is connected to the node $N_2$, while the other end of the channel is connected to the node $N_1$. This results in the node $N_3$ being boosted to $2V_{CC}$ when precharged, which brings the transistor $M_{52}$ into a conducting state to place the node $N_1$ and the node $N_2$ at the same potential. As a result, the output transistor $M_1$ is brought out of conduction. That is, when precharged in the series of operations described above, since the voltage across the node $N_1$ is lowered to $V_{CC}$ or less, while the node $N_2$ (gate electrode) is controlled to $V_{CC}$, and as a result, the output transistor $M_1$ is brought into conduction, a current flows backward from the output terminal (voltage=$V_{PP}$>$V_{CC}$) side. However, such a drop in the output voltage $V_{OUT}$ may be prevented through the use of the above-described modified version of the output section.

Figure 10A:
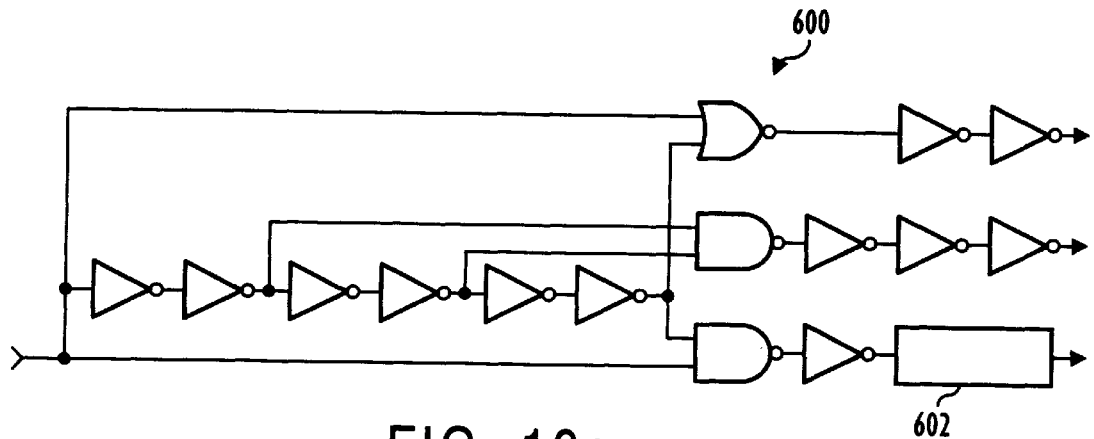
FIG. 10a and FIG. 10b are a circuit diagram illustrative of a modified version of the pulse converter section 600 available for use according to the first embodiment of the present invention, and a circuit diagram of a level converter circuit 602 available for use in the modified version, respectively.
Figure 10B:
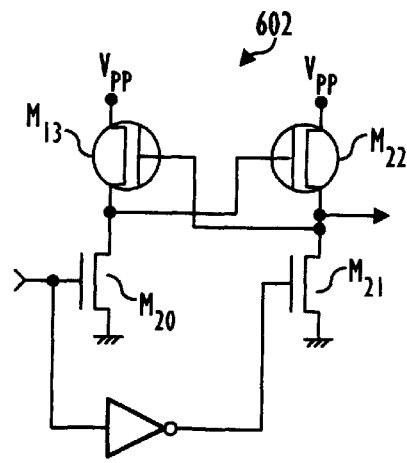

The pulse converter sections 600 and 601 according to the present embodiment may be modified as illustrated in FIG. 10a. Referring to FIG. 10b, in the pulse converter section, as an example, the illustrated modified version of the pulse converter section is characterized in that the level of the internal pulse signal for capacity coupling of the gate electrode of the output transistor $M_1$ of the output section 700 is converted from the source voltage $V_{CC}$ to the predetermined output voltage $V_{PP}$ through a level converter circuit 602. This results in the gate voltage of the output transistor $M_1$ being raised from $2V_{CC}$ to $V_{CC}+V_{PP}$ ($V_{CC}<V_{PP}$) during an voltage-boosting operation to further increase the voltage-boosting capability of the output transistor $M_1$. The level converter circuit 602 may be, for example, the one having the configuration as illustrated in the circuit diagram of FIG. 10b. Transistors M20–M21 and M22–M23 is n-channel type and p-channel type respectively.

As described above, the boosted-voltage generator circuit according to the present embodiment may be configured as illustrated in the circuit diagram of FIG. 5, or may be constructed of a variety of combinations of the modified version of the output section which is illustrated in FIG. 9 and the modified version of the pulse converter section which is illustrated in FIG. 10.

Figure 11:
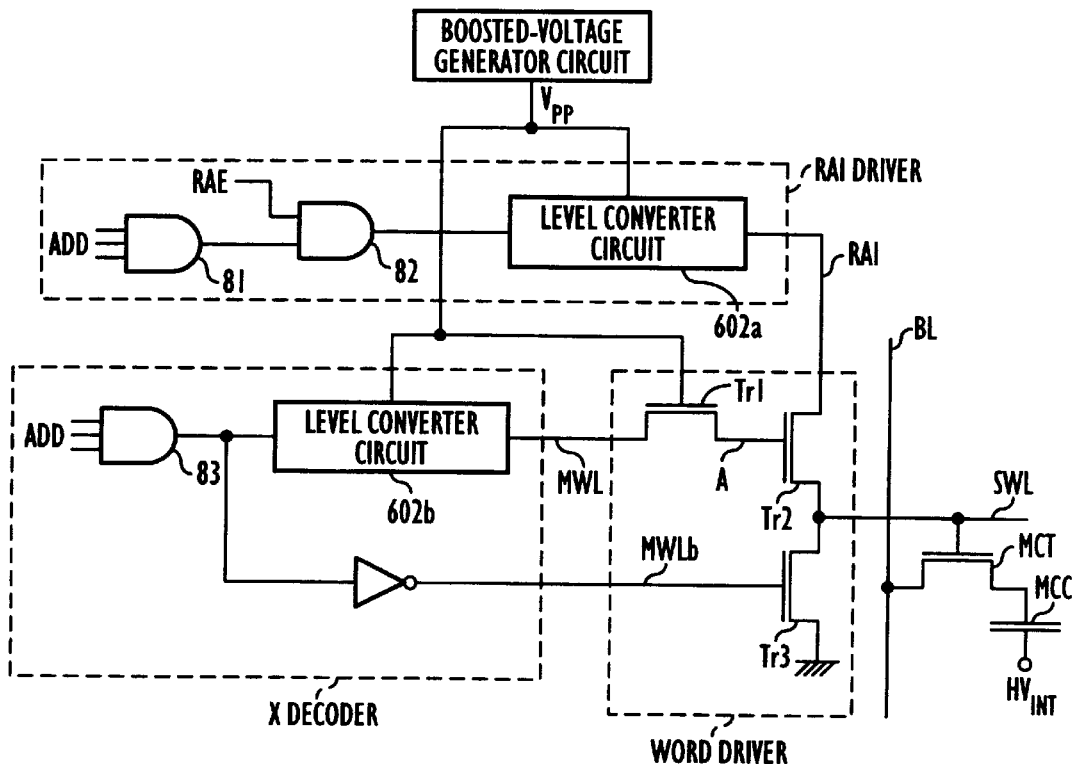
FIG. 11 is a circuit diagram of a semiconductor memory device including a boosted-voltage generator circuit of the present invention.
Figure 12:
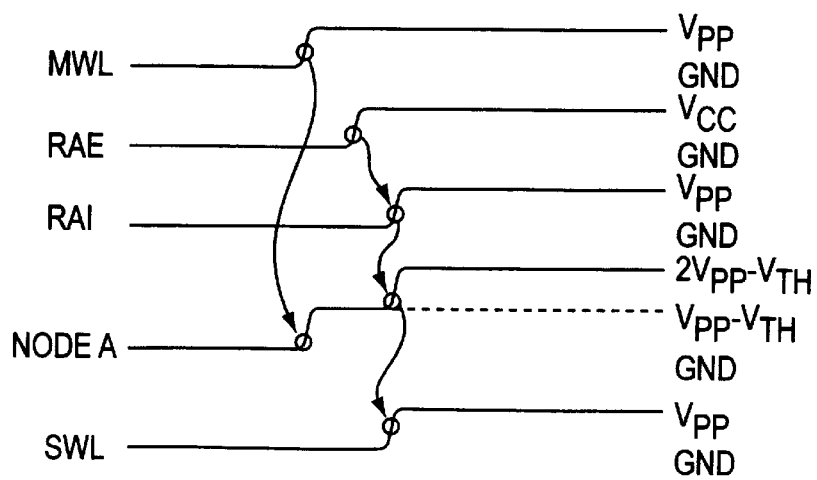
FIG. 12 is a timing chart illustrative of the operating waveforms of the voltage booster circuit section indicated in FIG. 5 of the present invention.

Referring to FIG. 11, the boosted-voltage generator circuit of the present invention is used on purpose to boost a level of a sub word line SWL to the voltage $V_{PP}$. Referring to FIG. 12, the operation of the semiconductor memory device shown in FIG. 11 will now be described in detail. When AND circuits 81, 83 receives a predetermined address signal ADD, they outputs H-level signals having an internal source voltage lower than the voltage $V_{PP}$. On the other hands, when a level converter circuit 602a receive a L (ground)-level signal, it outputs a L (ground) level signal and the level converter circuit 602b outputs the boosted voltage $V_{OUT}$ having the voltage $V_{PP}$ when it receives a H-level signal having the internal source voltage. The level converter circuit 602b moves the same movement as the level converter circuit 602a. Therefore, when X decoder receives a predetermined address signal ADD, a main word line MWL becomes the voltage $V_{PP}$, thereby changing a voltage of a node A to $V_{PP}$–Vth. The voltage Vth is a threshold voltage of transistor Tr1. On the other hand, the level converter circuit 602a receives H-level signal from NAND circuit 82. A RAE signal is a row address enable signal. The RAI driver outputs a RAI signal having the voltage $V_{PP}$. Then, the voltage of the node A is boosted from $V_{PP}$–Vth to $2V_{PP}$–Vth by a coupling capacitor between the node A and an electrode of a nMOS transistor Tr2 receiving the RAI signal. Therefore, the RAI signal having the voltage $V_{PP}$ transfers to a sub word line SWL. Transistors Tr1–Tr3 is n-channel type respectively.

Figure 13:
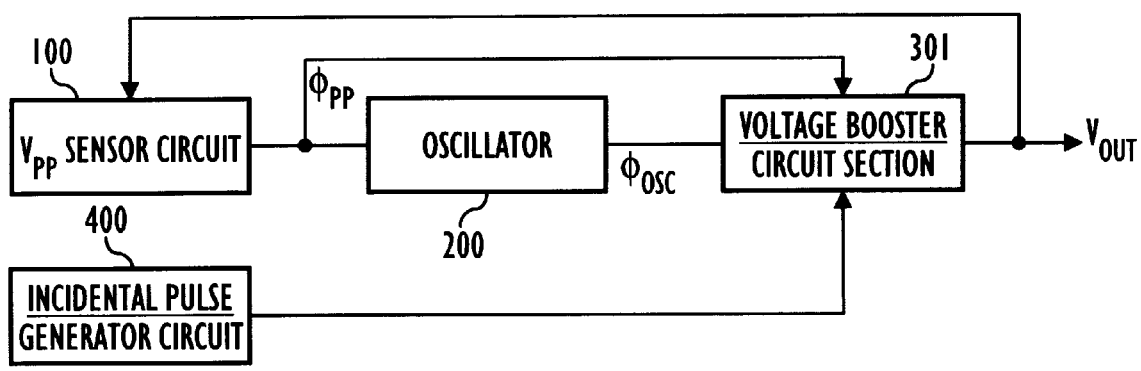
FIG. 13 is a block diagram of a boosted-voltage generator circuit according to a second embodiment of the present invention.
Figure 14:
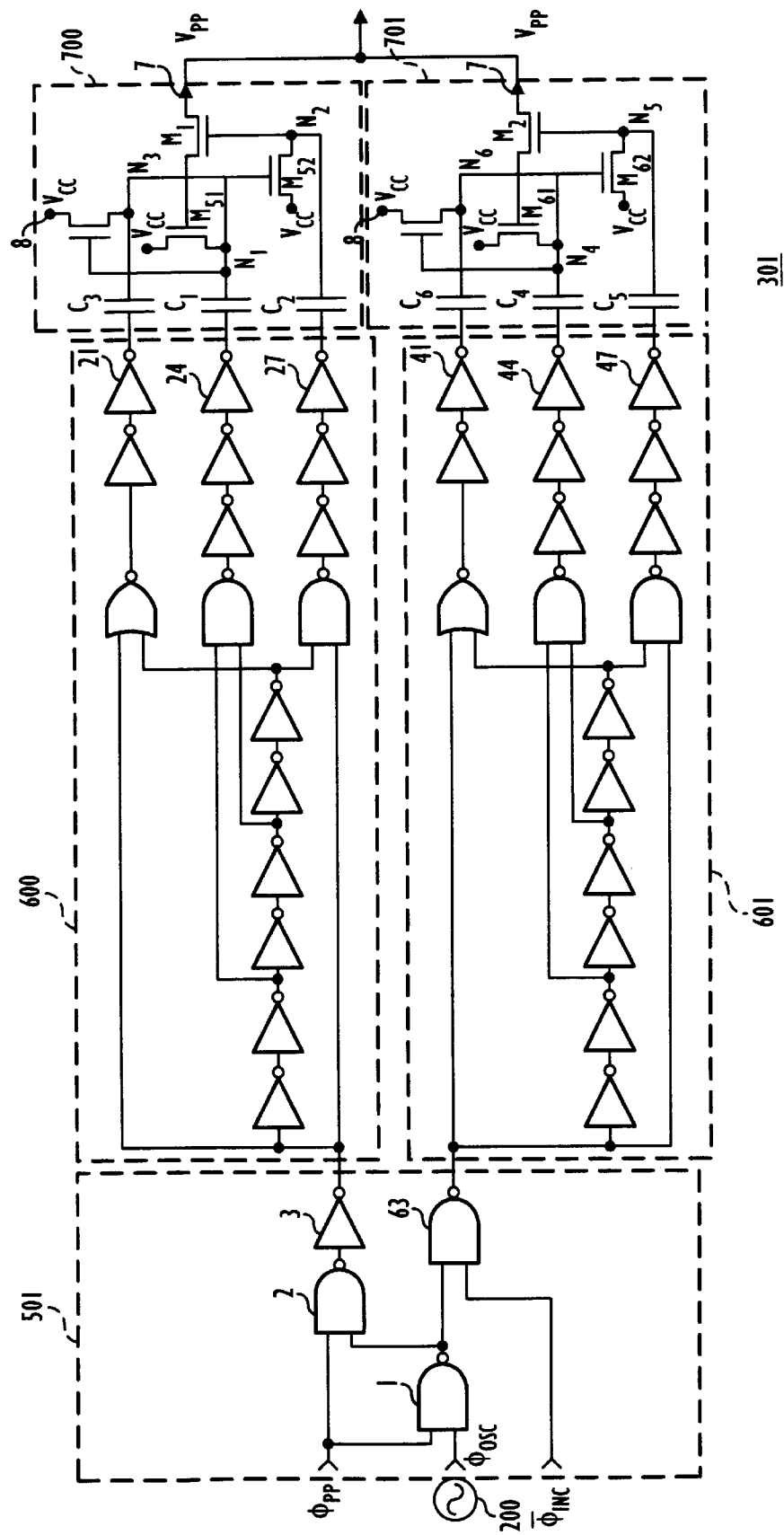
FIG. 14 is a circuit diagram of a voltage booster circuit section 301 available for use according to the second embodiment of the present invention.
Figure 15:
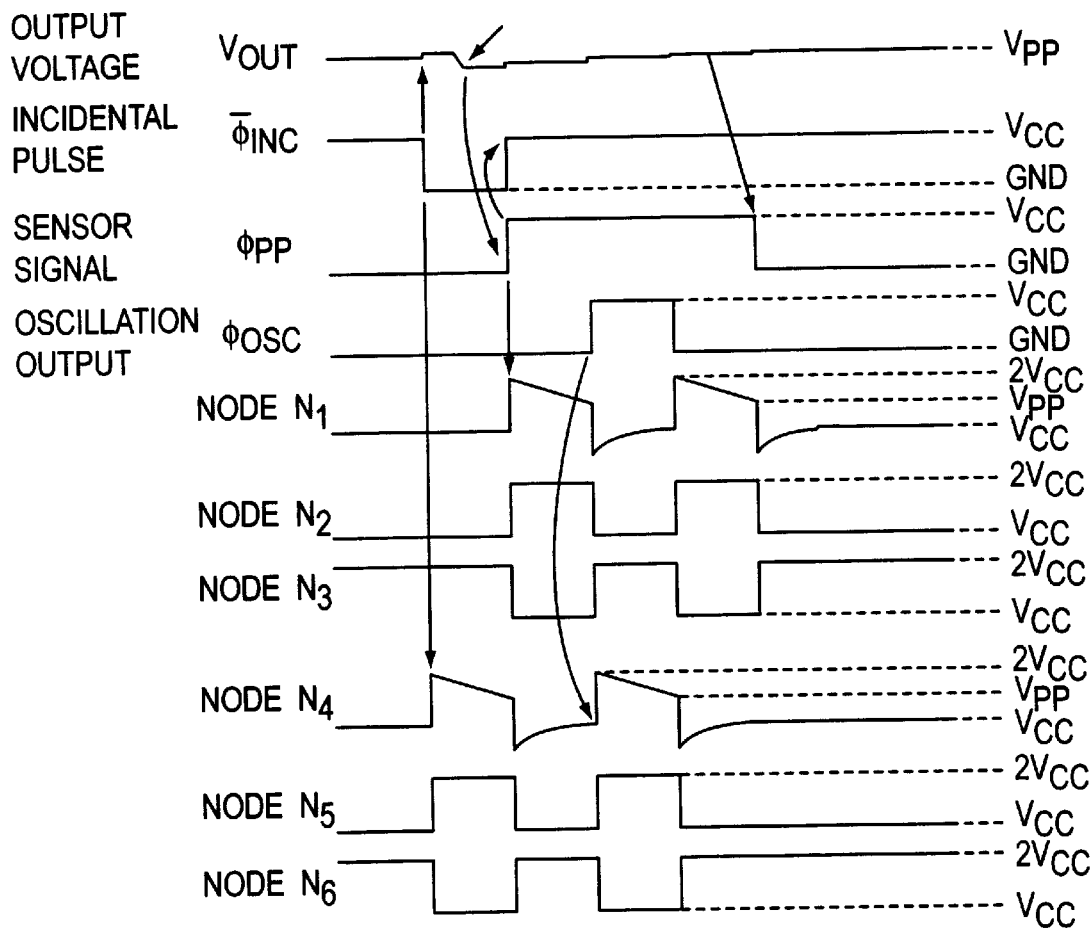
FIG. 15 is a timing chart illustrative of the operating waveforms observed according to the second embodiment of the present invention.

A second embodiment of the present invention will now be described. FIG. 13 is a block diagram of a boosted-voltage generator circuit according to the second embodiment of the present invention. In addition, FIG. 14 is a circuit diagram of the voltage booster circuit section 301 in the block diagram. Referring to FIG. 14, the present embodiment is a modification of the first embodiment illustrated in FIG. 5 which uses a modified version of the input section 501. The present embodiment performs a characteristic operation of actuating the voltage booster circuit section 301 between before and immediately after an operation to consume the boosted voltage $V_{PP}$ is initiated through an incidental pulse generator circuit 400 even while the $V_{PP}$ sensor signal $\phi_{PP}$ is in an inactive state, as illustrated in the operating waveform diagram of FIG. 15, in addition to the same operations as the first embodiment described above. Here, since the $V_{PP}$ sensor circuit 100 and the oscillator 200 may be configured in the same manner as according to the first embodiment, an explanation thereof is omitted.

Figure 16A:
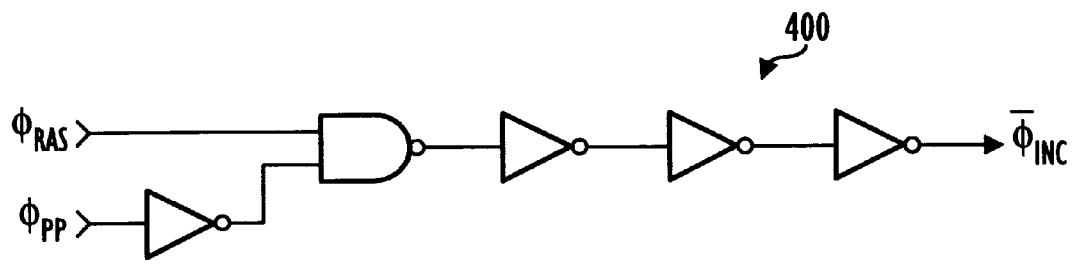
FIG. 16a and FIG. 16b are a circuit diagram of an incidental pulse generator circuit 400 available for use according to the second embodiment of the present invention, and a timing chart illustrative of the operating waveforms observed therein, respectively.
Figure 16B:
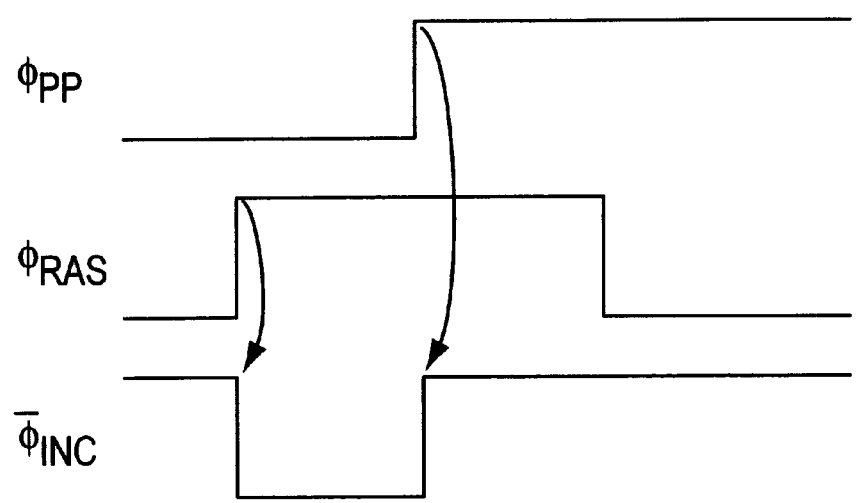

FIG. 16a is a circuit diagram of the incidental pulse generator circuit 400. FIG. 16b illustrates the operating waveforms observed therein. In FIG. 16b, the signal $\phi_{RAS}$ is a pulse signal which is generated between before and immediately after an operation of consuming the boosted voltage $V_{PP}$, for example, boosting of word lines, and an L-level $V_{PP}$-activating operation signal $\nabla\phi_{INC}$ ($\nabla$ substitutes for an upper bar indicating "inverse". This applies hereafter) when an H-level signal $\phi_{RAS}$ is input in cases where the sensor signal $\phi_{PP}$ is at the L level. Here, it is to be noted that the $V_{PP}$-activating operation signal $\nabla\phi_{INC}$ switches to the H level and is thus deactivated when the sensor signal $\phi_{PP}$ switches to the H level.

The operation according to the present embodiment will now be described. A $V_{PP}$-activating operation signal $\nabla\phi_{INC}$ is generated between before and immediately after an activating operation initiates to the predetermined voltage $V_{PP}$ of the output terminal (sensor signal $\phi_{PP}$ being at the L level) initiate an activating operation of lowering the voltage $V_{PP}$. This signal triggers an H-level signal to be output via a NAND gate 63, thereby initiating a voltage-boosting operation at the output section 701 side.

First, since the output signal from the inverter 44 switches to the H-level, the voltage across the node $N_4$ which has been precharged to the vicinity of the line voltage $V_{CC}$, is boosted to the vicinity of $2V_{CC}$ by the coupling capacitor $C_4$. In addition, since an L-level signal is output from the inverter 41, the voltage across the node $N_6$ which has been precharged to the vicinity of $2V_{CC}$ is dropped to the vicinity of the source voltage $V_{CC}$ by the coupling capacitor $C_6$. Further, since an H-level signal is output from the inverter 47, the voltage across the node $N_5$ which has been precharged to the vicinity of the source voltage $V_{CC}$, is boosted to the vicinity of $2V_{CC}$ by the coupling capacitor $C_5$.

After (or immediately after) this, since an activating operation of lowering the boosted voltage $V_{PP}$ is initiated, the output voltage $V_{OUT}$ drops. This drop in the voltage is, however, smaller than according to the first embodiment, since the voltage is somewhat higher than the predetermined $V_{PP}$. Then, when a drop in the output voltage $V_{OUT}$ is sensed by the $V_{PP}$ sensor circuit 100 and the sensor signal $\phi_{PP}$ switches to the H level, the signal $\nabla\phi_{INC}$ is raised to the H level, and a boosting operation is first performed at the output transistor $M_1$ side in the same manner as according to the first embodiment described above. The operation is the same as that according to the first embodiment.

The present embodiment is first characterized in that since an voltage-boosting operation may be performed against an activating operation of lowering the boosted voltage $V_{PP}$ even when the sensor signal $\phi_{PP}$ is at the L level, a drop in the output voltage $V_{OUT}$ from the predetermined $V_{PP}$ is made smaller, and as a result, the time necessary to recover the predetermined $V_{PP}$ after the sensor signal $\phi_{PP}$ has switched to the H level may be shortened. A second characteristic aspect of the present invention resides in that since the output transistor $M_1$ side is in a precharged state while a voltage-boosting operation is being performed in response to a $V_{PP}$-activating operation signal $\nabla\phi_{INC}$, the process may continuously shift to the voltage-boosting operation which has been described for the first embodiment, after the sensor signal $\phi_{PP}$ has switched to the H level.

Figure 17:
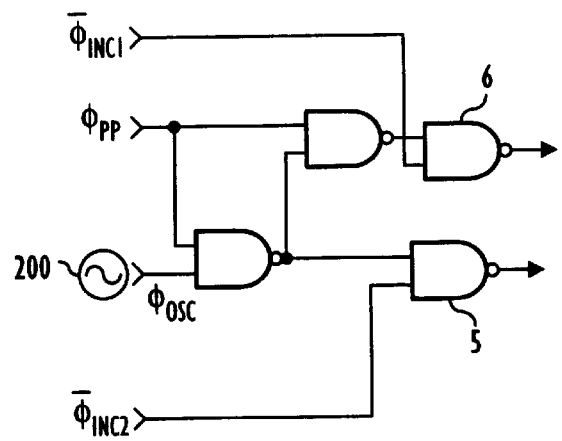
FIG. 17 is a circuit diagram illustrative of a modified version of the input section 502 available for use according to the second embodiment of the present invention.
Figure 18A:
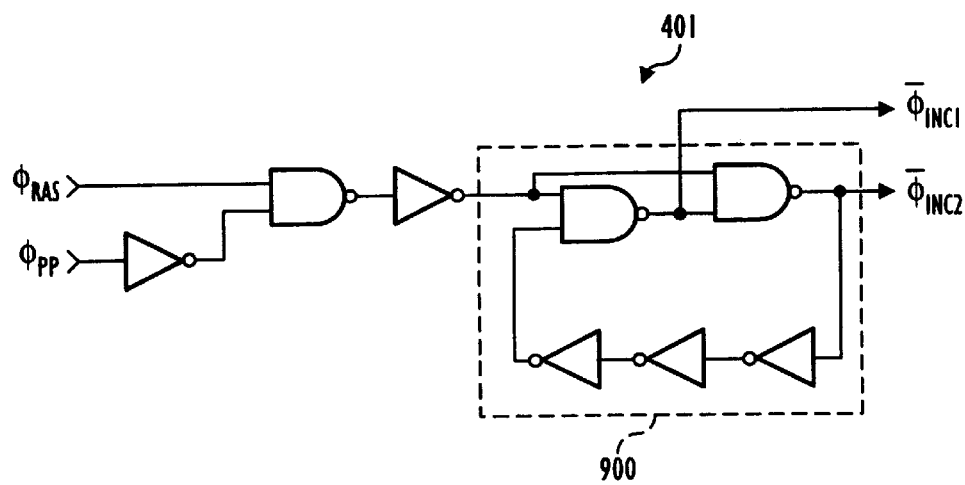
FIG. 18a and FIG. 18b are a circuit diagram of a modified version of the incidental pulse generator circuit 401 available for use according to the second embodiment of the present invention, and a timing chart illustrative of the operating waveforms observed therein, respectively.
Figure 18B:
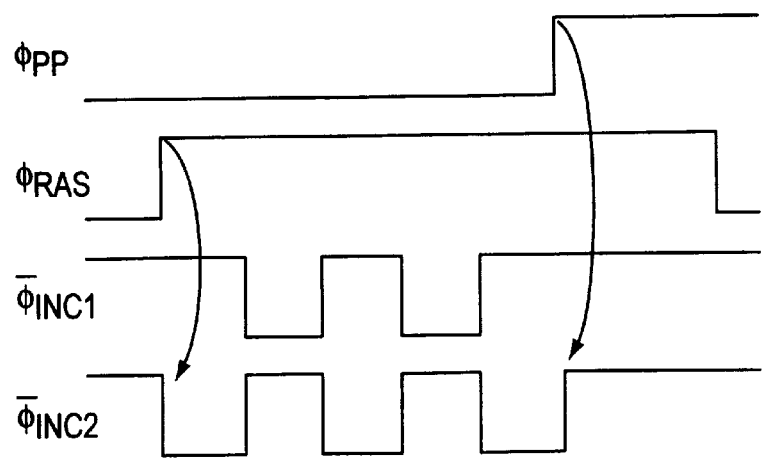

FIG. 17 is a circuit diagram of a modified version of the input section according to the present embodiment. In addition, FIG. 18a is a circuit diagram of a modified version of the incidental pulse generator circuit. FIG. 18b is a view illustrative of the operating waveforms in the modified version 401 of the incidental pulse generator circuit. In FIG. 18b, the signal $\phi_{RAS}$ is a pulse signal which is generated between before and immediately after an operation of consuming the boosted voltage $V_{PP}$, for example, boosting of word lines. When an H-level signal $\phi_{RAS}$ is input in cases where the sensor signal $\phi_{PP}$ is at the L level, an oscillator 900 in the circuit operates to input complementary $V_{PP}$-activating operation signals to NAND gates 5 and 6 in the input section in the order of $\nabla\phi_{INC2}$ and $\nabla\phi_{INC1}$. This results in a dummy of the voltage-boosting operation according to the first embodiment being performed in the boosted-voltage generator circuit according to the present invention. In addition, when the sensor signal $\phi_{PP}$ switches to the H level after the boosted voltage $V_{PP}$ has dropped, the oscillator 900 of the incidental pulse generator circuit 401 is suspended, and both the complementary $V_{PP}$-activating operation signals $\nabla\phi_{INC2}$ and $\nabla\phi_{INC1}$ switch to the H level, and the boosted-voltage generator circuit performs the same voltage-boosting operation as described for the first embodiment.

The circuit configuration is characterized in that an voltage-boosting operation may be performed against an activating operation of lowering the boosted voltage $V_{PP}$ even when the sensor signal $\phi_{PP}$ is at the L level, and as a result, a drop in the output voltage $V_{OUT}$ from the predetermined $V_{PP}$ is made smaller, and the time necessary to recover the predetermined $V_{PP}$ after the sensor signal $\phi_{PP}$ has switched to the H level may be shortened. It is further characterized in that the voltage-boosting operation may be continued with the oscillator in the incidental pulse generator circuit even when the sensor signal $\phi_{PP}$ is at the L level.

According to the present embodiment as well, likewise the first embodiment, the circuit, in addition to being configured as described above, may be configured as any of a variety of combinations of the modified version of the input section which is illustrated in FIG. 9 and the modified version of the pulse converter section which is illustrated in FIG. 10.

As described above, the present invention allows direct control of the actuation and suspension of a boosted-voltage generator circuit on the basis of sensor signals from a sensor circuit which senses drops in the output boosted voltage from a predetermined value. Accordingly, it is possible to restore the dropped, output boosted voltage to a predetermined value at high speed, without being delayed by the time required for initiating oscillation in the oscillator, and after recovering the predetermined value, the voltage-boosting operation may be suspended at once without delay due to the time required for suspending the oscillation in the oscillator. In this way, according to the present invention, it is possible to prevent fluctuations of the output boosted voltage due to increased drops in the voltage which result from the delayed oscillation in the oscillator and also due to an excess increase in the voltage because of the delayed suspension of the oscillator, and to speed up the process of return to a predetermined value as well, more reliably than according to the prior art.

In addition, even in the case of boosting the voltages across word lines, for example, since it is possible to carry out a boosting operation even if the sensor signal from the sensor circuit is inactive, thereby setting the output boosted voltage higher than a predetermined value, the output boosted voltage to be consumed may be prevented from fluctuating, and the time required for the return to the predetermined value may be shortened.

According to the present invention, the gate voltages of transistors for precharging the voltage-boosting capacitors in a boosted-voltage generator circuit to the line voltage, are securely boosted to or above the line voltage by alternate charging and discharging of the precharging capacitors.

Since the present invention allows the voltage-boosting transistors to be reliably precharged to the line voltage in this way, the voltage-boosting capability of the boosted-voltage generator circuit may be made greater than that of the prior art, and thus the process of return to a predetermined value may be speeded up.

It is apparent that the present invention is not limited to the above embodiments, and may be modified and changed without departing from the scope and spirit of the invention.

For example the circuit of the present invention is not only applied to a voltage-boosted circuit but also a voltage lowering circuit.

What is claimed is:

1. A semiconductor circuit comprising:

a sensor circuit receiving an output signal and outputting a sensor signal;

an oscillator receiving said sensor signal and outputting an oscillator signal; and a voltage generation circuit receiving said sensor signal and said oscillator signal and outputting said output signal, wherein said voltage generation circuit includes an input section receiving said sensor signal and said oscillator signal and outputting first and second response signals, a first pulse converter section receiving said first response signal to produce first, second, third pulse signals, a second pulse converter section receiving said second response signal to produce fourth, fifth, and sixth pulse signals, a first output section receiving said first, second, and third signals to produce said output signal and a second output section receiving said fourth, fifth, and sixth pulse signals to produce said output signal, and further wherein said first output section comprises a first capacitor having a first electrode receiving said first pulse signal and a second electrode, a second capacitor having a third electrode receiving said second pulse signal and a fourth electrode, a third capacitor having a fifth electrode receiving said third pulse signal and a sixth electrode, a first output transistor coupled between said second electrode and an output terminal and having first control gate coupled to said fourth electrode, a first precharge transistor coupled between a power source line and said second electrode and having a second control gate coupled to said sixth electrode, a second precharge transistor coupled to said fourth electrode and having a third control gate coupled to said sixth electrode, and a third precharge transistor coupled between said power source line and said sixth electrode and having a fourth electrode coupled to said second electrode.

2. The semiconductor circuit as claimed in claim 1, wherein said second output section comprises a fourth capacitor having a seventh electrode receiving said fourth pulse signal and an eighth electrode, a fifth capacitor having a ninth electrode receiving said fifth pulse signal and a tenth electrode, a sixth capacitor having an eleventh electrode receiving said sixth pulse signal and a twelfth electrode, a second output transistor coupled between said eighth electrode and said output terminal and having fifth control gate coupled to said tenth electrode, a fourth precharge transistor coupled between said power source line and said eighth electrode and having an eighth control gate coupled to said twelfth electrode, a fifth precharge transistor coupled to said tenth electrode and having a seventh control electrode coupled to said twelfth electrode, and a sixth precharge transistor coupled between said power source line and said twelfth electrode and having a fourth electrode coupled to said eighth electrode.

3. The semiconductor circuit as claimed in claim 1, wherein said input section outputs said first and second response signals each having first logic level when said sensor signal is at said first logic level regardless of levels of said oscillation signal, outputs said first response signal having a second logic level and said second response signal having said first logic level when said sensor signal is at said second logic level and said oscillation signal is at said first logic level, and said first response signal having said first logic level and outputs said second response signal having said second logic level when said sensor signal is at said second logic level and said oscillation signal is at said second logic level, and wherein said first pulse signal changes from said second logic level to said first logic level, said second pulse signal changes from said first logic level to said second logic level with a first delay period, and third pulse signal changes from said first logic level to said second logic level with a second delay period longer than said first delay period when said first response signal changes from said first logic level to said second logic level.

4. A semiconductor circuit comprising:

an oscillator having a control node and an output node, wherein said oscillator stops an oscillation thereof while said control node is at a first logic level so as not to produce a pulse signal at said output node, and wherein said oscillator starts the oscillation in response to a change of said control node from said first logic level to a second logic level so as to start producing said pulse signal at said output node, said oscillator continues the oscillation while said control node is at said second logic level so as to keep producing said pulse signal at said output node, said oscillator stopping said oscillation thereof in response to a change of said control node from said second logic level to said first logic level so as to stop producing said pulse signal at said output node;

a voltage generator coupled to said output node and performing a voltage-boosting operation in response to said pulse signal to generate an output voltage; and a sensor circuit coupled to said voltage generator to detect a level of said output voltage and produce a detection signal, said detection signal taking said first logic level when said output voltage is equal to or greater than a predetermined level and taking said second logic level when said output voltage is smaller than said predetermined level;

said detection signal is fed back to said control node of said oscillator and further to said voltage generator such that a change of said detection signal from said first logic level to said second logic level causes said voltage generator to commence performance of said voltage-boosting operation to recover the level of said output voltage before said pulse signal appears at said output node of said oscillator and a change of said detection signal from said second logic level to said first logic level causes said voltage generator to stop performing said voltage boosting operation before said pulse signal disappears at said output node of said oscillator.

5. The semiconductor circuit as claimed in claim 4, wherein said voltage generator includes an input section comprising:

a first NAND gate coupled to said output node of said oscillator and receiving said detection signal to produce a first response signal; and a second NAND gate receiving said detection signal and said first response signal to produce a second response signal.

6. The semiconductor circuit as claimed in claim 4, wherein said voltage generator includes an input section and first and second output sections, and wherein said input section produces first and second pulse signals in response to said detection signal and said oscillation signal, and said first output section includes:

a first capacitor having first and second electrodes;

a first transistor connected to form a first electrical path between said second electrode of said first capacitor and a power source terminal to precharge said second electrode of said capacitor in response to said first pulse signal;

a second transistor connected to form a second electrical path between said second electrode of said first capacitor and an output terminal to output said output voltage to said output terminal in response to said first pulse signal;

and said second output section includes:

a second capacitor having third and fourth electrodes;

a third transistor connected to form a third electrical path between said fourth electrode of said second capacitor and said power source terminal to precharge said fourth electrode of said second capacitor in response to said second pulse signal; and a fourth transistor connected to form a fourth electrical path between said fourth electrode of said second capacitor and said output terminal to output said output voltage to said output terminal in response to said second pulse signal so that said first output section produces said output voltage in response to said first pulse signal independent of said second output section and said second output section produces said output voltage in response to said second pulse signal independent of said first output section.

* * * * *